United States Patent

Kugelmann et al.

[11] Patent Number: 5,581,096
[45] Date of Patent: Dec. 3, 1996

[54] INTEGRATED SEMICONDUCTOR DEVICE HAVING A THYRISTOR

[75] Inventors: Adolf Kugelmann, Leonberg; Vinko Marolt, Reutlingen; Uwe Guenther, Nufringen; Oliver Schatz, Reutlingen, all of Germany

[73] Assignee: Robert Bosch GmbH, Stuttgart, Germany

[21] Appl. No.: 343,409

[22] Filed: Nov. 22, 1994

[30] Foreign Application Priority Data

Dec. 10, 1993 [DE] Germany .......................... 43 42 166.0

[51] Int. Cl.⁶ .......................... H01L 29/74; H01L 31/111
[52] U.S. Cl. .......................... 257/162; 257/163; 257/164
[58] Field of Search .......................... 257/162, 163, 257/164, 147, 148, 149, 151, 152, 153

[56] References Cited

U.S. PATENT DOCUMENTS 4,258,377  3/1981  Miyata et al. .......................... 257/162

FOREIGN PATENT DOCUMENTS 2026778  12/1971  Germany .
2705990   8/1978  Germany .
2909795   9/1979  Germany .
3513987  10/1986  Germany .

*Primary Examiner*—Wael M. Fahmy
*Attorney, Agent, or Firm*—Kenyon & Kenyon

[57] ABSTRACT

An integrated semiconductor device having a thyristor includes outer npn-transistors, outer pnp-transistors, and an inner npn-transistor. The outer pnp-transistors and the inner npn-transistor are interconnected so as to form a thyristor to allow the inner transistor to be biased into conduction. Furthermore, a current flow takes place via the outer npn-transistors and the inner npn-transistor. The integrated semiconductor device having a thyristor minimizes interference produced in neighboring components.

6 Claims, 2 Drawing Sheets

INTEGRATED SEMICONDUCTOR DEVICE HAVING A THYRISTOR

FIELD OF THE INVENTION

The present invention relates to an integrated semiconductor device having a thyristor.

BACKGROUND OF THE INVENTION

A thyristor in an n-type well is described in German Patent Application No. DE 20 26 778. The thyristor has a central p-type doping, in which an n-type doping zone is embedded. In addition, outer p-regions are provided in the n-type well. The outer p-regions, the n-type well, the inner p-type doping, and the inner n-type doping produce a thyristor. To isolate this thyristor dielectrically from other devices, the n-type well is completely surrounded by a p-region.

SUMMARY OF THE INVENTION

The advantage of the semiconductor device according to the present invention is that a component is created which can be used as a thyristor in which the essential current flow takes place via majority carriers and not via minority carriers. Therefore, the device according to the present invention produces very little interference in other neighboring components. The present invention is also advantageous in that a plurality of semiconductor devices having a thyristor are able to be inserted side-by-side, without interactions occurring among the individual semiconductor devices.

According to the present invention, the metal contacting for the inner p-type doping provides a gate for triggering the thyristor. The bulk spreading resistance between the anode and cathode is kept low by means of the buried layer. The comb-shaped formation of the outer n-type doping allows the current flow through the outer npn-transistor or the pnp-transistor to be influenced. This measure provides for a uniform distribution of the current flow over the surface of the semiconductor component.

The p-diffusions 12 create a leakage resistance between the base and the emitter of the inner npn-transistor 20. The leakage resistance prevents the thyristor from being triggered because of temperature-induced reverse-blocking currents in the lateral pnp-transistors or because of steep voltage edges at the anode.

By forming recesses in the outer p-type doping below the outer n-type doping, so that the outer n-type doping comes in contact with the n-type well, a leakage resistance is created. This leakage resistance prevents the thyristor from being triggered in the case of steep voltage edges or temperature-induced reverse-blocking currents.

The relationship between the majority current and the minority current can be influenced by appropriately laying out the surface between the outer metallization plating and the outer p-type doping or n-type doping.

DETAILED DESCRIPTION OF THE INVENTION

Figure 1:
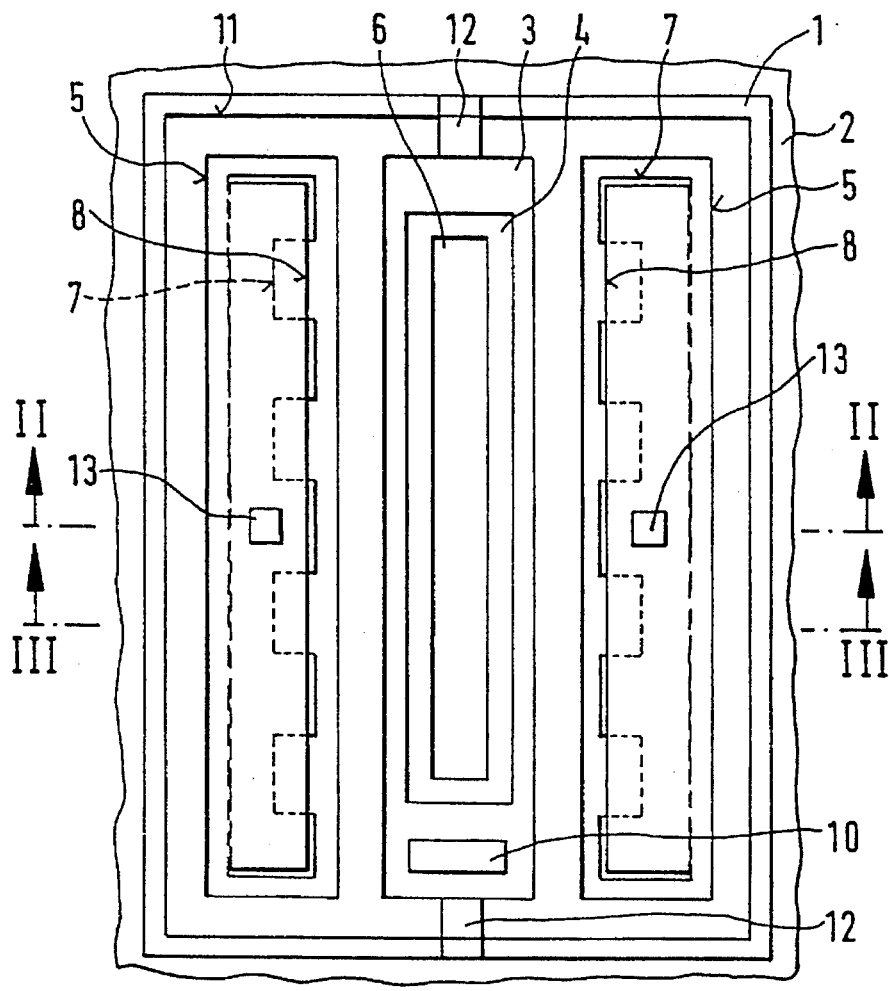
FIG. 1 shows a top view of the semiconductor component according to the present invention.
Figure 2:
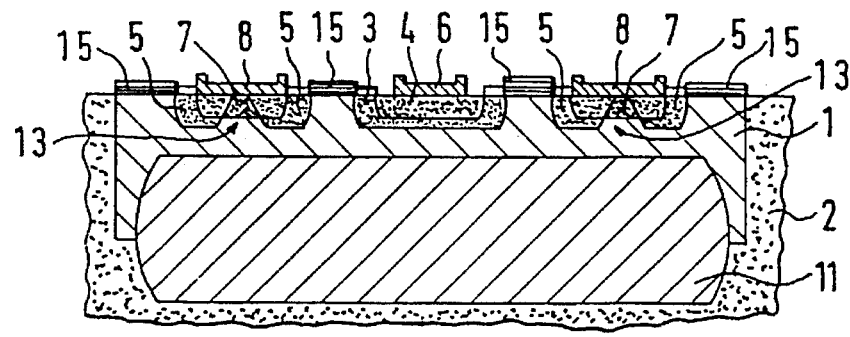
FIG. 2 shows a cross-section through the semiconductor component according to the present invention along line II—II of FIG. 1.
Figure 3:
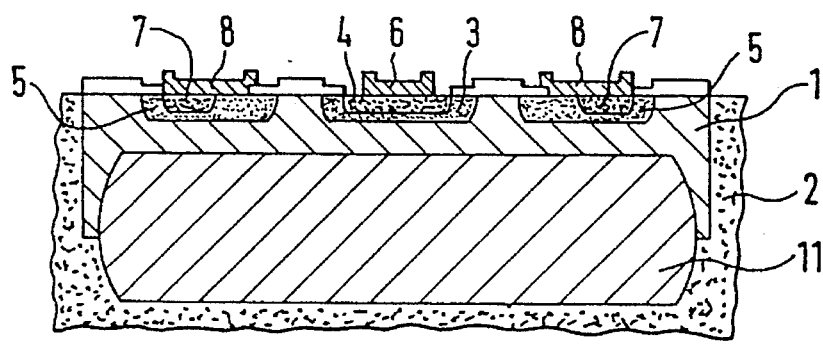
FIG. 3 shows another cross-section through the semiconductor component according to the present invention along line III—III of FIG. 1.

FIG. 1 illustrates a top view of the semiconductor element according to the present invention, while FIGS. 2 and 3 show a cross-section along the lines II—II and III—III of FIG. 1, respectively. An n-doped well 1 is provided in a p-substrate 2. FIG. 1 shows the outer dimensions of this n-type well 1. FIGS. 2 and 3 show the extension of the n-type well 1 into the depth of the p-substrate 2.

A heavily n-doped buried layer 11 is provided in the lower region of the weakly n-doped well 1. An inner p-doping 3 is arranged approximately in the middle of the n-type well 1. An inner n-doping 4 is arranged inside the inner p-doping 3. The inner n-doping 4 is completely embedded in this case in the inner p-doping 3, so that there is no direct contact between the inner n-doping 4 and the n-type well 1. The inner n-doping 4 is contacted through an inner metallization 6.

Outer p-dopings 5 are provided on both sides of the inner p-doping 3. The outer p-dopings 5 have essentially a rectangular shape, a recess 13 being provided, however, at one location. FIG. 2 shows a cross-section along these recesses 13.

Outer n-dopings 7 are arranged in the outer p-dopings 5. Since the lateral and vertical dimensions of the outer p-doping 5 are greater than those of the outer n-doping, the outer n-doping 7 does not contact the n-type well 1, except for the area of the recess 13. As FIG. 2 shows, the outer n-dopings 7 are in direct contact, however, with the n-type well 1 in the area of the recess 13 of the outer p-doping 5.

An outer metallization 8 is provided in the area of the outer p-doping 5 and the outer n-doping 7. This outer metallization 8 is in contact both with the outer p-doping 5, as well as with the outer n-doping 7. Since the outer metallizations 8 are designed as rectangular regions, this is achieved in that the outer n-doping 7 is designed as a comb-shaped structure, as shown in the top view of FIG. 1.

In addition, the inner p-doping 3 is provided with a metal contact 10. Other p-dopings 12 are also provided, which are arranged so as to allow a connection to be established between the inner p-region 3 and the p-substrate 2.

The cross-sections of FIGS. 2 and 3 also show a passivation layer 15, as is customary in semiconductor elements. The passivation layer 15 is not shown in the top view of FIG. 1.

Figure 4:
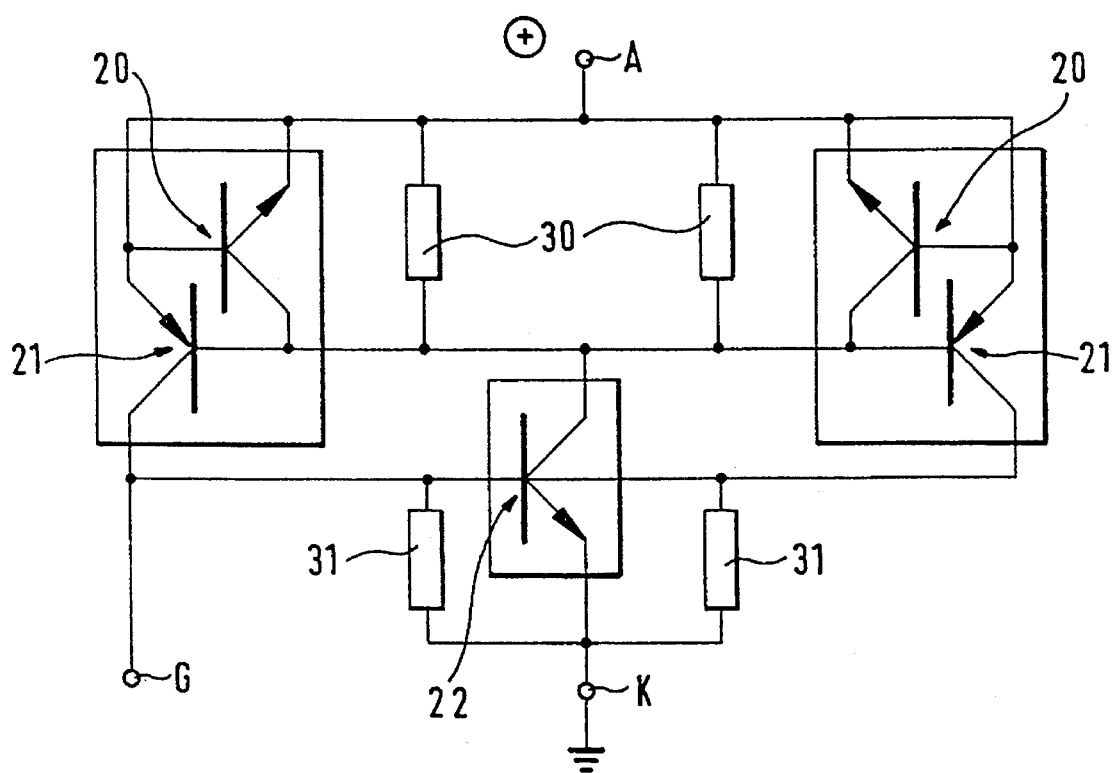
FIG. 4 shows an equivalent circuit diagram of the semiconductor component according to the present invention.

An equivalent circuit diagram of the thus formed semiconductor device according to the present invention is shown in FIG. 4. The semiconductor device has an anode terminal A, a cathode terminal K, and a gate terminal G. Also configured are outer npn-transistors 20, outer pnp-transistors 21, anode leakage resistors 30, cathode leakage resistors 31, and an inner npn-transistor 22.

The anode terminal A is formed by the outer metallizations 8. The cathode terminal K is formed by the inner metallization 6. The gate terminal G is formed by the metal contact 10. The outer npn-transistor 20 is formed by the outer n-doping regions 7 as an emitter, the outer p-dopings 5 as a base, and the n-type well 1 as a collector. The outer pnp-transistors 21 are formed by the outer p-dopings 5 as an emitter, the n-type well 1 as a base, and the inner p-doping 3 as a collector. The inner npn-transistor 22 is formed by the inner n-doping 4 as an emitter, the inner p-doping 3 as a base, and the n-type well 1 as a collector.

The cathode leakage resistors 31 are formed by the additional doping regions 12, which connect the inner p-doping 3 with the p-substrate 2. The substrate and the cathode terminal are both connected to ground. The anode leakage resistors 30 are made up of the direct contact of the outer n-dopings 7 with the n-type well 1 in the area of the recesses 13 of the outer p-doping 5. A thyristor is formed by the interconnection of the outer pnp-transistors 21 and the inner npn-transistor 22.

The thus designed semiconductor device can be used as a thyristor. For this purpose, the anode terminal can be connected to a more positive potential than the cathode terminal, for example, the anode terminal to a positive supply voltage and the cathode terminal to ground. The thyristor can then be triggered by a triggering pulse at the gate terminal G.

A thyristor is formed by the outer p-doping 5, the n-type well 1, the inner p-doping 3, and the inner n-doping 4. The current flow through this thyristor takes place in this case in the n-region of the n-type well 1 through the minority carriers injected by the outer p-doping 5. The transfer of the minority carriers takes place in this case not on the basis of a directional field, but rather on the basis of a diffusion process. In this case, many of these minority carriers can diffuse away into other semiconductor regions and, thus, interfere with other semiconductor elements. However, this effect is lessened or completely suppressed by the outer npn-transistors 20.

The outer npn-transistors 20 are made up of the outer n-doping 7, the outer p-doping 5, and the n-type well 1. When a positive voltage is applied to the anode (relative to the cathode), this transistor is operated in an inverse direction, and consequently the emitters and collectors are reversed (commutated) compared to normal integrated transistors. Thus, the current amplification of this transistor is small, but can be tolerated, since the emitter and base are short-circuited.

When a voltage is applied to the metallizations 8, majority carriers are produced in the outer n-regions 7 and reach through the p-doping 5 serving as a base of the transistor right into the n-type well 1. These majority carriers can then flow via the heavily doped buried layer 11 to the inner npn-transistor 22, which is formed by the inner n-doping 4 of the inner p-doping 3 and the subjacent region of the n-type well 1. Since the doping region 3, which forms the base of the inner npn-transistor 22, at the same time also makes up a part of the thyristor, which is activated by the minority current, the inner npn-transistor 22 is connected through when the transistor is triggered. The majority carriers injected by the outer npn-transistor 20 can thus flow off via the inner npn-transistor 22.

Of crucial importance in this case is that the larger portion of the current flow takes place between the anode and cathode via majority carriers and not via minority carriers. On the basis of the current amplification of the inner npn-transistor 22, only a small minority carrier current via the thyristor is necessary to render possible a large majority carrier current via the outer npn-transistors 20 and the inner npn-transistor 22. Consequently, only a few minority carriers capable of producing interference are produced by the semiconductor element.

Furthermore, as a result of the flow of the majority carriers in the n-type well 1 or in the buried layer 11, a field gradient is produced, which first of all drives the majority carriers injected into the n-type well 1 into the middle of the component and, thus, prevents this minority carrier from being diffused away into other semiconductor regions. Secondly, the field gradient displaces the region of the buried layer, which is more negative in terms of potential and which injects minorities into the p-substrate, to the middle of the component and, consequently, increases the distance of the injector from the neighboring element.

The depicted comb-shaped development of the outer n-dopings 7 influences the ratio of minority carrier current to majority carrier current. The outer p-regions 5 act only as part of a thyristor in those regions in which the outer metallizations 8 are in direct contact with the p-regions 5. The magnitude of the current flowing via the thyristor depends in this case upon the edge length of the regions of the doping regions 5 contacted by the metallization 8 on the side facing the inner doping region 3. The reason for this is that a current flow takes place predominantly in the lateral direction. On the other hand, the magnitude of the majority carrier current depends on the surface between the metallizations 8 and the outer n-dopings 7. This is because a current flow takes place predominantly in the perpendicular direction toward the buried layer 11. Because of the comb-shaped formation of the outer n-dopings 7, the largest part of the chip surface is now used for the outer npn-transistors 20, and thus for the majority carrier current.

By appropriately dividing up the edge length on the inner side of the comb structure, the current required to bias the inner npn-transistor 22 into conduction can then be adjusted by means of the thyristor. Since a certain minimum overlapping region of metallization 8 and p-region 5 must be guaranteed to allow tolerances when the individual masking levels are superimposed during manufacture of the switching circuits, a certain surface must be made available for this contacting. However, one must strive to use the largest part of the surface (larger at least by a factor of four) for the outer npn-transistors.

The anode leakage resistors 30 prevent a triggering of the thyristor in the case of steep voltage edges between the anode and the cathode. The anode leakage resistors 30 also prevent a triggering of the thyristor in the case of penetration of majorities into the n-type well 1 from neighboring n-regions, and also in the case of penetration of majorities into the n-type well 1 from neighboring n-regions.

The structure shown with one inner region and two outer regions arranged on both sides of the inner region can be expanded upon correspondingly to include other geometric configurations. For example, the inner region can be developed with a circular shape and the outer region can likewise be developed with a circular shape.

The components according to the present invention enable a plurality of components of this type to be arranged and operated side-by-side. During operation of one of these components, the neighboring components are not disturbed. It is thus possible, even in the case of components arranged closely side-by-side, to activate them individually, the danger of neighboring components also being activated by parasitic effects being minimal. Since the components according to the present invention are started and kept in operation by thyristors, a short pulse suffices for activation. The components can thus be activated with very low power. Components according to the present invention can be used quite advantageously to balance integrated circuits by burning out arc gaps, the components also being activated in this case by other integrated elements.

What is claimed is:

1. An integrated semiconductor device, comprising:
   an inner p-doped region disposed in a n-type well, the n-type well being embedded in a p-type substrate;
   an inner n-doped region embedded in the inner p-doped region;
   at least one outer p-doped region disposed in the n-type well;
   wherein the inner n-doped region, the inner p-doped region, the n-type well and the at least one outer p-doped region form a thyristor;
   an inner metallization element connected to the inner n-doped region;
   at least one outer n-doped region that is at least partially embedded in the at least one outer p-doped region; and
   an outer metallization element connected to the at least one outer n-doped region and to the at least one outer p-doped region;
   wherein the at least one outer n-doped region is comb-shaped such that the outer metallization element contacts an inside portion of the at least one outer p-doped region.

2. The semiconductor device according to claim 1, further comprising a metal contact exclusively connected to the inner p-doped region.

3. The semiconductor device according to claim 1, further comprising a buried layer disposed in the n-type well, the n-type well shielding the buried layer from a surface of the semiconductor device.

4. The semiconductor device according to claim 1, further comprising at least one additional p-doped region disposed in the n-type well for connecting the inner p-doped region and the p-type substrate.

5. The semiconductor device according to claim 1, wherein the at least one outer p-doped region includes a recess below the at least one outer n-doped region so that the at least one outer n-doped region contacts the n-type well.

6. The semiconductor device according to claim 1, wherein the outer metallization element contacts the at least one outer n-doped region along a first surface, the outer metallization element contacts the at least one outer p-doped region along a second surface, and wherein the first surface is larger than the second surface.

* * * * *